United States Patent [19]

Hauser

[11] Patent Number: 5,059,981

[45] Date of Patent: Oct. 22, 1991

[54] ARRANGEMENT AND METHOD FOR COVERTING AN ANALOG VOLTAGE SIGNAL TO A DIGITAL SIGNAL UTILIZING THE ABSOLUTE VALUE OF THE ANALOG SIGNAL

[75] Inventor: Karl-Heinz Hauser, Bruckmuhl, Fed. Rep. of Germany

[73] Assignee: Messerschmitt Bölkow-Blohm GmbH, Munich, Fed. Rep. of Germany

[21] Appl. No.: 480,884

[22] Filed: Feb. 16, 1990

[30] Foreign Application Priority Data

Mar. 3, 1989 [DE] Fed. Rep. of Germany ....... 3906754

[51] Int. Cl.$^5$ ............................................. H03M 1/50
[52] U.S. Cl. .................................... 341/164; 341/166
[58] Field of Search ............... 341/164, 165, 110, 116, 341/127, 158, 166; 318/808

[56] References Cited

U.S. PATENT DOCUMENTS

| | | | |
|---|---|---|---|
| 3,895,377 | 7/1975 | Schwalenstocker | 341/164 |
| 4,471,285 | 9/1984 | Kawada et al. | 318/808 |
| 4,733,043 | 3/1988 | Bell | 219/69 G |

FOREIGN PATENT DOCUMENTS 2434517  3/1975  Fed. Rep. of Germany .

OTHER PUBLICATIONS

"Elektronik-Applikation [Electronic Application]", No. 20, Oct. 11, 1988, p. 39.
Fletcher, W. I., An Engineering Approach to Digital Design, 1980 Prentice-Hall, Inc., p. 322.

Primary Examiner—A. D. Pellinen
Assistant Examiner—Brian K. Young
Attorney, Agent, or Firm—Kenyon & Kenyon

[57] ABSTRACT

An arrangement for integrating an analog voltage signal and for converting it into a corresponding digital signal, whereby during a measuring cycle, the analog signal is fed via a comparator to a counting circuit, which to provide the time-related control of the operation of the counter is connected to a variable clock frequency generator device controlled by the analog signal. The comparator is connected to a "D"-flipflop, which is connected to an up-down counter with a digital-to-analog converter, on whose counting input is provided the $\overline{Q}$-output of the variable clock frequency generator, which changes its clock frequency according to the absolute value of the voltage to be integrated.

8 Claims, 1 Drawing Sheet

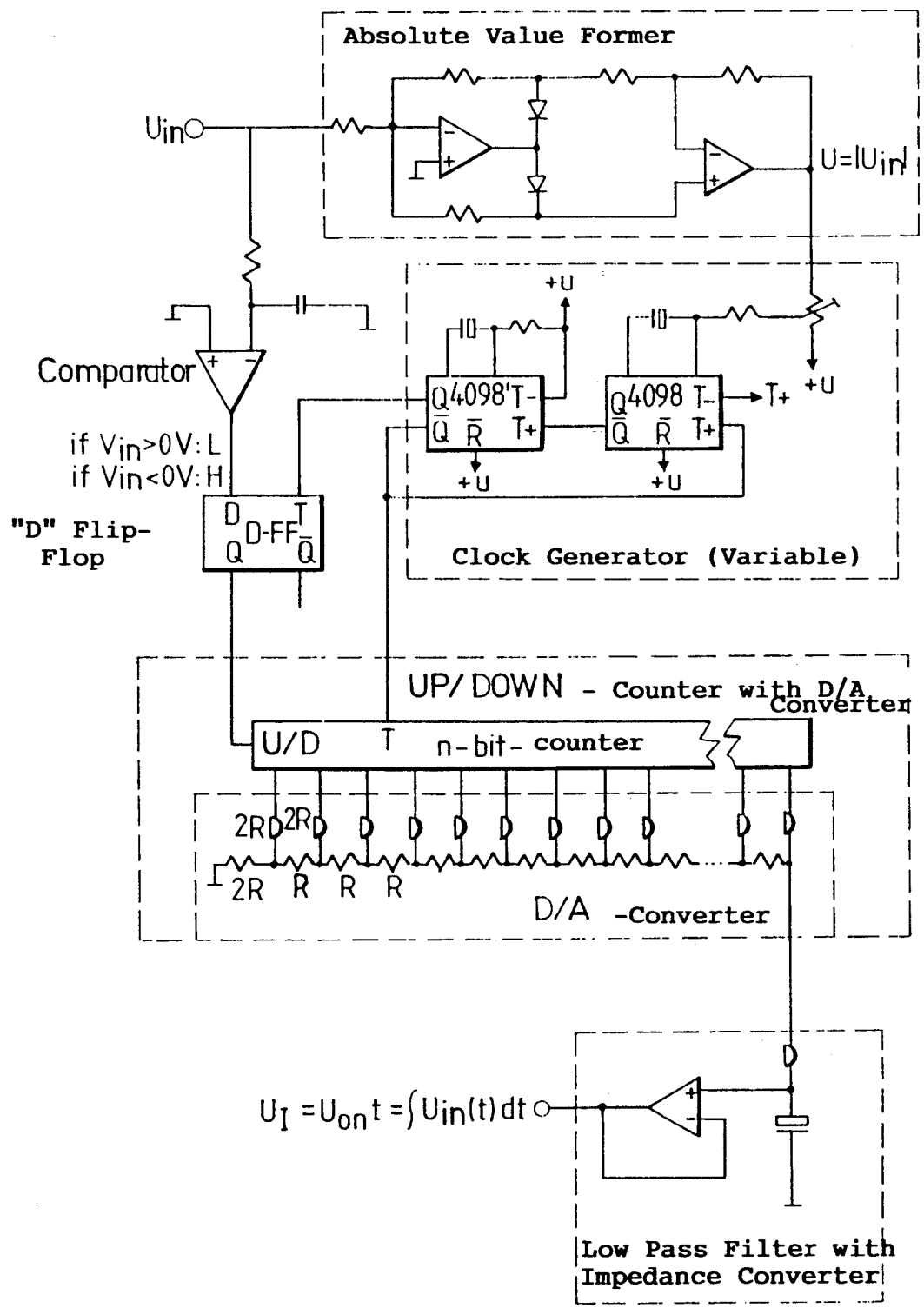

ARRANGEMENT AND METHOD FOR COVERTING AN ANALOG VOLTAGE SIGNAL TO A DIGITAL SIGNAL UTILIZING THE ABSOLUTE VALUE OF THE ANALOG SIGNAL

BACKGROUND OF THE INVENTION

The present invention relates to an arrangement for integrating an analog voltage signal and for converting it into a corresponding digital signal, whereby during a measuring cycle, the analog signal is fed via a comparator to a counting circuit, which to provide the time-related control of the counter is connected to a clock generator device controlled by the absolute value of the analog signal.

Detecting elements, in particular all kinds of sensors, generate an analog signal, particularly an absolute voltage value, which, with the help of most integrating transformers, can be converted into a digital output signal.

A survey of integrating circuits can be found in the periodical Elektronik-Applikation [Electronic Application], No. 20 of Oct. 11, 1988, page 39.

As German Patent 24 34 517 points out, when obtaining the digital output signal, it is important to keep deviation errors small.

In known circuits with long integration times, the value of the integration is corrupted by the components in Harente-drift.

SUMMARY OF THE INVENTION

An object of the present invention is to create an arrangement, where the analog value is applied in a noncorrupted form at the output of a counter, and particularly for n-bits.

The above and other objects of the invention are achieved by an arrangement for integrating an analog voltage signal and for converting the analog voltage signal into a corresponding digital signal, whereby during a measuring cycle, the analog signal is fed via a comparator to a counting circuit, the counting circuit being connected to a variable clock frequency generator controlled by the analog signal provide time-related control of the counter, the comparator being connected to a "D"-flipflop the "D"-flipflop being connected to an up-down counter having a digital-to-analog converter, the up-down counter having a counting input coupled to a Q-output of the variable clock frequency generator, the clock generator changing its clock frequency according to the absolute value of the analog voltage signal to be integrated.

BRIEF DESCRIPTION OF THE DRAWINGS

An exemplified embodiment of the invention is depicted schematically in the single drawing figure.

DETAILED DESCRIPTION

With reference now to the drawing, the signal to be integrated is thereby fed as a voltage $U_{in}$ to a circuit, which forms the absolute value of the voltage to be integrated in an absolute value former. This absolute value former is connected to a variable clock generator, which is designed such that its clock frequency from 0 Hz to $f_{max}$ can be modified according to the absolute value of the integrating voltage. The clock generator is connected to an up-down counter with a digital-to-analog converter, and the latter to a low-pass filter with an impedance converter. The n-bit up-down counter output is connected to a resistor network for the digital-to-analog conversion. The up-down counter is connected to a "D"-flipflop, which is connected to a comparator, which at a voltage $U_{in}$ greater than 0 V yields logic state L and, at a voltage $U_{in}$ less than 0 V yields alogic state H. The "D"-flipflop is also connected to the Q-output of the clock generator.

The signal to be integrated is fed to a circuit, which forms the absolute value of the voltage to be integrated. Secondly, the signal to be integrated is fed to a comparator, which decides if the signal to be integrated is greater or less than 0 V. The output of the comparator is fed to the D-input of a "D"-flipflop. If now, during a positive edge-triggering at the clock input of the "D"-flipflop, the logic state at the D-input of the "D"-flipflop is high, then the Q-output of the "D"-flipflop becomes logical high. The Q-output of the "D"-flipflop becomes logical low, when during a positive edge-triggering at the clock input, the D-input is logical low.

For the downstream counter, logical high at the Q-output of the "D"-flipflop means that it should count up. Logical low at the Q-output of the "D"-flipflop means that the downstream counter should count down.

The absolute value of the input voltage to be integrated is fed to a clock generator. This clock generator modifies its clock frequency from 0 Hz to $f_{max}$ according to the absolute value of the voltage to be integrated.

The Q-output of the variable clock generator controls the "D"-flipflop; the $\overline{Q}$-output of the variable clock generator is connected to the counting input of the counter. As a result of the combination of a comparator, variable clock generator, and "D"-flipflop and U/D-counter, it is possible to have a counting operation which is free of interfering input signals.

Thus, with each positive edge-triggering at the Q-output of the clock generator, an up or down counting operation is instructed by the "D"-flipflop, which then leads with a negative edge-triggering at the Q-output of the clock generator to the actual counting operation in the counter. As a result of the modification of the clock frequency of the clock generator as a function of the absolute value of the voltage to be integrated, one is able to modify the integration time, as a function of the voltage to be integrated.

The counter output is fed to a digital-to-analog converter. Thus, the analog value of the digital-to-analog output corresponds to the counter content. A low-pass filter, connected downstream from the digital-to-analog converter, with an impedance converter, adapts the high-resistance output of the digital-to-analog converter to the continuing signal processing and smooths out the voltage steps of the digital-to-analog converter.

Important for the functioning of the drift-free integrator are: generating the absolute value of the signal to be integrated; changing the counting frequency rate as a function of the absolute value of the voltage to be integrated; the function of the comparator, which decides if the counter should count up or down; and the combination counter output-digital-to-analog converter. The stage comprising the low-pass filter and impedance converter downstream from the digital-to-analog converter is necessary for the overall functioning, but is of secondary importance.

It is possible for one of skill in the art to slightly alter the exemplified embodiment within the scope of the claims. Applications are possible, for example, in inertial systems, and in control loops with substantial time constants.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. An arrangement for integrating an analog voltage signal and for converting the analog voltage signal into a corresponding digital signal, whereby during a measuring cycle, the analog signal is fed via a comparator to a counting circuit, the counting circuit being directly connected to a variable clock frequency generator device controlled by the analog signal to provide tie-related control of the counting circuit, the comparator being connected to a "D"-flipflop, the "D"-flipflop having a Q output connected to an up-down control input of an up-down counter having a counting output connected to a digital-to-analog converter, the up-down counter having a counting input coupled to the Q output of the variable clock frequency generator, the variable clock frequency generator changing it clock frequency according to the absolute value of the analog voltage signal to be integrated.

2. The arrangement recited in claim 1, wherein a low pass filter with an impedance converter is connected downstream from the digital-to-analog converter, and low pass filter adapting the analog value output of the digital-to-analog converter for further signal processing.

3. The arrangement recited in claim 1, wherein the analog signal to be integrated is fed to a comparator, which decides if the counter should count up or down, or if the voltage signal to be integrated is greater or less than 0.

4. The arrangement recited in claim 1, wherein the output of the comparator is connected to a D-input of the "D"-flipflop, so that during a positive edge-triggering at a clock input of the "D"-flipflop, the logic state at eh D-input of the "D"-flipflop is high, and a Q-output of the "D"-flipflop also becomes logic high.

5. The arrangement recited in claim 4, wherein the Q-output of the "D"-flipflop becomes logic low, when during a positive edge-triggering at the clock input of the "D"-flipflop, the D-input is logic low.

6. The arrangement recited in claim 4, wherein the logic high at the Q-output of the "D"-flipflop indicates that the up-down counter should count up, and logic low at the Q-output of the "D"-flipflop indicates that the up-down counter should count down.

7. A method for converting an analog voltage signal into a corresponding digital signal during a measuring cycle in a circuit having a clock generator device for time-related control of the operation of an integrator, comprising changing the integration time as a function of the absolute value of the voltage to be integrated by changing the clock frequency of the clock generator as a function of the absolute value of the voltage to be integrated such that with each positive signal edge at the Q-output of the clock generator, an up or down counting cycle is initiated by a "D"-flipflop, which then, at a negative signal edge at the Q-output of the clock generator, controls a counting cycle in an n-bit counter the method further comprising the steps of outputting a counter signal from then-bit counter to a digital-to-analog converter and producing an analog value output from the digital-to-analog converter, the analog value output corresponding to the counter signal.

8. An arrangement for integrating an analog voltage signal and for converting the analog voltage signal into a corresponding digital signal, whereby during a measuring cycle, the analog signal is fed via a comparator to a counting circuit, the counting circuit being directly connected to a variable clock frequency generator device controlled by the analog signal to provide time-related control of the counting circuit, the comparator being connected to a "D"-flipflop, the "D"-flipflop having a Q output connected to an up-down control input of an up-down counter having a counting output connected to a digital-to-analog converter, the digital-to-analog converter having an analog value output corresponding to the counting output, the up-down counter having a counting input coupled to the Q output of the variable clock frequency generator, the variable frequency generator changing clock frequency according to the absolute value of the analog voltage signal to be integrated.

* * * * *

UNITED STATES PATENT AND TRADEMARK OFFICE
CERTIFICATE OF CORRECTION

PATENT NO. : 5,059,981
DATED : October 22, 1991
INVENTOR(S) : Karl-Heinz Hauser

It is certified that error appears in the above-indentified patent and that said Letters Patent is hereby corrected as shown below:

On the Title page, item [54], in the Title, change "...COVERTING..." to read --CONVERTING--.

Column 1, line 45, change (both occurrence) "flip-flop" to read flipflop--

Column 3, line 20, change "tie-" to read --time--.

Column 3, line 28, change "it" to read --its--.

Column 3, line 33, change "and" to read --the--.

Column 4, line 24, change "then-bit" to read --the n-bit--.

Signed and Sealed this

Seventh Day of September, 1993

*Attest:*

BRUCE LEHMAN

*Attesting Officer*     *Commissioner of Patents and Trademarks*